(12) United States Patent
Kuna et al.

(10) Patent No.: US 11,487,322 B2
(45) Date of Patent: Nov. 1, 2022

(54) PORTABLE ELECTRONIC DEVICE

(71) Applicant: Apple Inc., Cupertino, CA (US)

(72) Inventors: Melody L. Kuna, San Jose, CA (US); Ryan J. Mihelich, Morgan Hill, CA (US); Taylor Harrison Gilbert, Los Gatos, CA (US); Joel N. Ruscher, Fremont, CA (US); Carli E. Oster, San Francisco, CA (US); Alex Chun Lap Yeung, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 16/848,678

(22) Filed: Apr. 14, 2020

(65) Prior Publication Data
US 2020/0241595 A1 Jul. 30, 2020

Related U.S. Application Data

(63) Continuation of application No. 16/396,471, filed on Apr. 26, 2019, now Pat. No. 10,649,489.
(Continued)

(51) Int. Cl.
*G06F 1/16* (2006.01)
*H02J 7/02* (2016.01)
(Continued)

(52) U.S. Cl.
CPC .......... *G06F 1/1626* (2013.01); *G06F 1/1637* (2013.01); *G06F 1/1656* (2013.01);
(Continued)

(58) Field of Classification Search
USPC ......... 381/87, 104, 152, 190, 322, 334, 335, 381/336
See application file for complete search history.

(56) References Cited

U.S. PATENT DOCUMENTS 5,210,984 A  5/1993 Eckel
8,327,974 B1 12/2012 Smith, Jr. et al.
(Continued)

FOREIGN PATENT DOCUMENTS

CN  203012655 U  6/2013
CN  105897962 A  8/2016
(Continued)

OTHER PUBLICATIONS

Chinese Patent for Utility Model No. ZL201920927410.9—Utility Model Patentability Evaluation Report dated May 7, 2020.
(Continued)

*Primary Examiner* — Yosef K Laekemariam
(74) *Attorney, Agent, or Firm* — BakerHostetler

(57) ABSTRACT

An electronic device is disclosed. The electronic device may include an enclosure and a transparent cover. The electronic device may include a display assembly. The electronic device may further include an inductive charging unit designed to inductively charge a stylus, or other object suitable for use with the display assembly. The electronic device may further include audio modules, at least some of which are designed to cause resonation of the enclosure to produce acoustical energy in the form of audible sound. Some audio modules produce acoustical energy in relatively low frequencies, while other audio modules produce acoustical energy in relatively high frequencies. The electronic device may further include a vision system designed for facial recognition. The display assembly may include a metal chassis as well as antennae for wireless communication. In order to prevent antennae interference, the metal chassis can be electrically grounded to the enclosure.

12 Claims, 12 Drawing Sheets

Related U.S. Application Data

(60) Provisional application No. 62/731,627, filed on Sep. 14, 2018.

(51) Int. Cl.
    *H04R 1/02*           (2006.01)
    *H04N 5/225*         (2006.01)
    *H04R 1/40*           (2006.01)
    *G06F 3/041*         (2006.01)
    *H05K 7/14*           (2006.01)
    *H02J 50/10*         (2016.01)

(52) U.S. Cl.
    CPC .......... *G06F 1/1684* (2013.01); *G06F 1/1686* (2013.01); *G06F 3/041* (2013.01); *H02J 7/025* (2013.01); *H02J 50/10* (2016.02); *H04N 5/2253* (2013.01); *H04N 5/2256* (2013.01); *H04R 1/025* (2013.01); *H04R 1/028* (2013.01); *H04R 1/403* (2013.01); *H04R 1/406* (2013.01); *H05K 7/1427* (2013.01); *H04R 2499/11* (2013.01)

(56) References Cited

U.S. PATENT DOCUMENTS

| | | | |
|---|---|---|---|
| 9,658,641 | B2 | 5/2017 | Stephens et al. |
| 9,972,934 | B1 | 5/2018 | Taylor et al. |
| 2017/0066011 | A1* | 3/2017 | Kole ...................... B05D 5/083 |
| 2017/0068288 | A1* | 3/2017 | Uttermann ............... G06F 1/203 |
| 2017/0170858 | A1* | 6/2017 | Tiller .................. B60R 11/0241 |
| 2017/0294906 | A1 | 10/2017 | Wagh et al. |
| 2018/0084323 | A1 | 3/2018 | Luce et al. |
| 2018/0084680 | A1 | 3/2018 | Jarvis et al. |
| 2018/0124934 | A1 | 5/2018 | Franklin et al. |
| 2018/0182387 | A1 | 6/2018 | Chua et al. |
| 2019/0223571 | A1 | 7/2019 | Chan et al. |

FOREIGN PATENT DOCUMENTS

| | | |
|---|---|---|
| CN | 106502317 A | 3/2017 |
| CN | 108446035 A | 8/2018 |

OTHER PUBLICATIONS

International Application No. PCT/US2019/033301 International Search Report and Written Opinion dated Sep. 11, 2019.

\* cited by examiner

PORTABLE ELECTRONIC DEVICE

CROSS-REFERENCE TO RELATED APPLICATION(S)

The present application is a continuation of U.S. application Ser. No. 16/396,471, filed Apr. 26, 2019, entitled "PORTABLE ELECTRONIC DEVICE," issued on May 12, 2020 as U.S. Pat. No. 10,649,489, which claims the benefit of U.S. Provisional Application No. 62/731,627, filed on Sep. 14, 2018, titled "PORTABLE ELECTRONIC DEVICE," the contents of all of which are incorporated by reference herein in their entirety for all purposes.

FIELD

The following description relates to electronic devices. In particular, the following description relates to various features of a portable electronic device, which may include a mobile wireless communication device and/or a tablet computing device.

BACKGROUND

Portable computing devices, including tablet computing devices, may include a housing and a cover glass coupled to the housing. Portable computing devices may also include display with touchscreen technology. Portable computing devices may also include a camera.

SUMMARY

In one aspect, a portable electronic device is described. The portable electronic device may include an enclosure that includes a back wall and sidewalls that extends from the back wall to define an internal volume. The portable electronic device may further include internal walls extending from the back wall and positioned between the sidewalls. The portable electronic device may further include an audio module coupled with the internal walls. The audio module may acoustically drive the back wall to generate acoustical energy.

In another aspect, a portable electronic device is described. The portable electronic device may include an enclosure that defines an internal volume. The enclosure may include a sidewall. The portable electronic device may further include a transparent cover coupled with the enclosure. The portable electronic device may further include a display assembly covered by the transparent cover. The display assembly may include a display layer and a touch input layer capable receiving a touch input that alters visual information presented by the display layer. The portable electronic device may further include an inductive charging unit positioned within the internal volume along the sidewall. The inductive charging unit may be capable of inductively charging an object external to the enclosure and used to provide an input to the touch input layer that alters the visual information.

In another aspect, a portable electronic device is described. The portable electronic device may include an enclosure that defines an internal volume. The portable electronic device may further include a border that extends along the transparent cover. The border may include a uniform dimension and an opening. The portable electronic device may further include a light transmitting material that is positioned in the opening. The portable electronic device may further include a vision system positioned in the internal volume and aligned with the light transmitting material. The vision system may be capable of object recognition.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
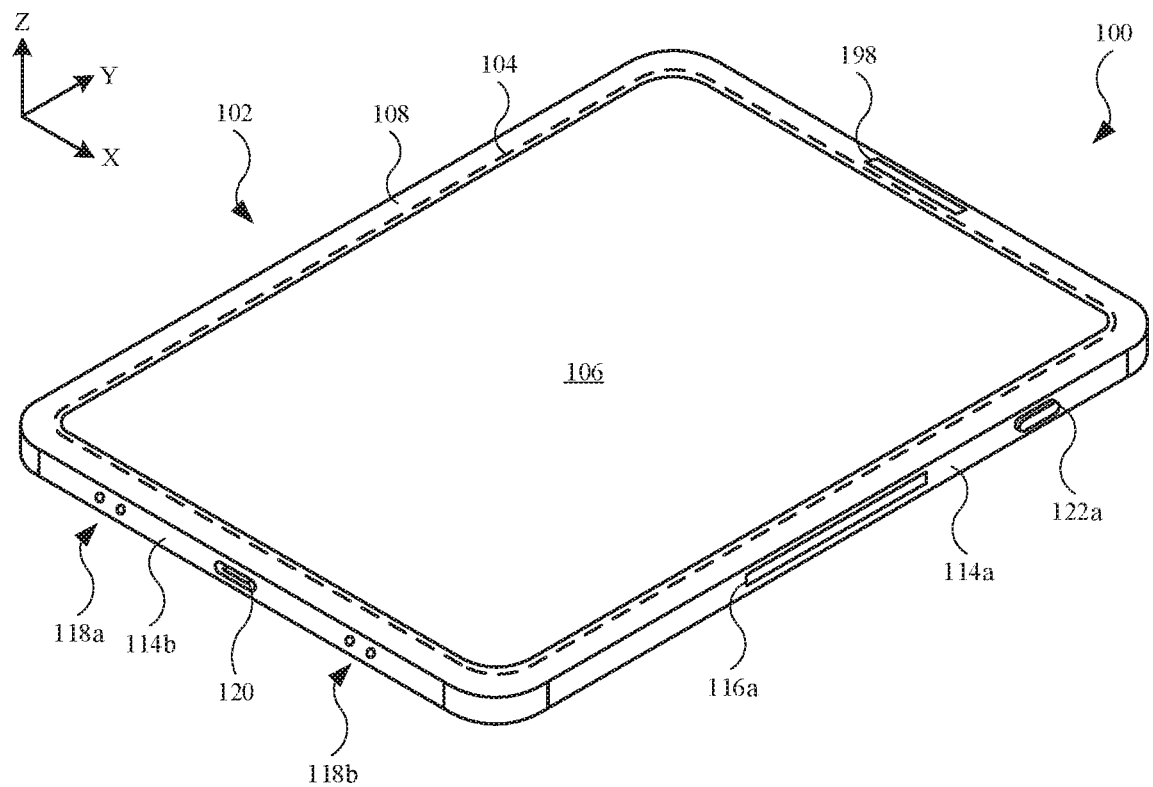
FIG. 1 illustrates an isometric front view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to electronic devices. Electronic devices described herein may include mobile wireless communication devices (such as smart phones) and tablet computing devices, as non-limiting examples. An electronic device described herein may include multiple audio speakers distributed throughout the electronic device. Further, some audio speakers produce low-frequency sound, while other audio speakers produce high-frequency sound. As a result, the electronic device may provide a dynamic range of sound. Moreover, some audio speakers, when in use, may acoustically drive the enclosure, or housing, of the electronic device, thereby resonating the enclosure.

The electronic device may further include several microphones distributed throughout the electronic device. Some microphones may be positioned against a sidewall of the enclosure or another wall of the enclosure. Further, some microphones may be positioned on other components. For example, some microphones are positioned on a bracket used to carry a vision system, while other microphones are coupled with a display assembly of the electronic device. Regarding the vision system, the electronic device may use the vision system to provide facial recognition and user authentication. This may, in some instances, eliminate the need for "home button" with a fingerprint sensor, or some input mechanism positioned on the front of the electronic device in an opening of a transparent cover of the electronic device. Accordingly, a dedicated opening for a button in the transparent cover can be eliminated.

The display assembly of the electronic device may include a touch input layer that used capacitive touch technology and alters an electrostatic field in a location corresponding to a user touch input. However, the touch input layer may alter its electrostatic field through interaction with a digital stylus. In this regard, the electronic device may include an inductive charging unit designed to provide an electrical current to the digital stylus in order to charge a battery of the digital stylus. The battery may store energy as a result of receiving electrical current, and subsequently supply the energy to components of the digital stylus, such as a processor circuit, a capacitive component, and a radio circuit.

These and other embodiments are discussed below with reference to FIGS. 1-16. However, those skilled in the art will readily appreciate that the detailed description given herein with respect to these Figures is for explanatory purposes only and should not be construed as limiting.

FIG. 1 illustrates an isometric front view of an embodiment of an electronic device 100, in accordance with some described embodiments. The electronic device 100 may be referred to as a portable electronic device. For example, in some embodiments, the electronic device 100 is a laptop computing device. In other embodiments, the electronic device 100 is a mobile wireless communication device, such as a smartphone. In the embodiment shown in FIG. 1, the electronic device 100 is a tablet computing device designed for user interaction and wireless communication.

The electronic device 100 may include an enclosure 102, or housing, designed to provide an internal volume (not labeled) to store several components, including (as non-limiting examples) circuit boards, processor circuits, memory circuits, battery (or batteries), audio modules (such as speakers), microphones, cameras, light emitters and receivers, and flexible circuitry that electrically connect at least some of the aforementioned components to each other. The enclosure 102 may include a back wall and multiple sidewalls that extend from, and combine with, the back wall define the internal volume. The enclosure 102 may include a rigid material, including a metal (such as aluminum or an alloy that includes aluminum), ceramic, or hardened plastic, as non-limiting examples.

The electronic device 100 may further include a display assembly 104 (shown as a dotted line). Although not shown, the display assembly 104 may include multiple layers, including a display layer designed to provide visual information. The display assembly 104 may further include a touch input layer designed to receive a touch input, and provide a location of the touch input. The touch input layer may include capacitive touch technology used to form an electrostatic field and use changes in the electrostatic field to locate the touch input. The electronic device 100 may further include a transparent cover 106 positioned over the display assembly 104 and coupled with the enclosure 102. The transparent cover 106 may provide a protective cover to the display assembly 104 as well as the aforementioned components stored in the internal volume. The transparent cover 106 may include a see-through material, such as glass, plastic, sapphire or the like. The electronic device 100 may further include a border 108 that extends around a perimeter of the transparent cover 106 and covers edges of the display assembly 104. The border 108 may provide an opaque barrier that hides or obscures electrical connections between the display assembly 104 and other components (not shown in FIG. 1). The border 108 may be applied to an internal surface of the transparent cover 106, and accordingly, the border 108 faces the internal volume. However, in some instances (not shown), the border 108 may be applied to an external surface. Also, the border 108 may include a uniform dimension along the X-axis as well as the Y-axis. In this manner, the border 108 may appear uniform along a two-dimensional plane, thereby providing the electronic device 100 with an aesthetic and consistent finish.

While the border 108 is opaque, or at least substantially opaque, some portions of the border 108 can be removed to form an opening (or openings). Further, the opening(s) in the border 108 can be filled with a material that provides a light transmission (or translucent) quality, while also matching, or at least substantially matching, the appearance (in terms of color and/or reflectivity) of the border 108. For example, the border 108 may include an opening with a material 198 that fills the opening. The material 198 may include an ink material (as a non-limiting example) that includes an appearance that matches that of the border 108. For example, if the border 108 appears black, the material 198 may also appear black while still allowing light passage. In this manner, the electronic device 100 may include a vision system for user authentication, as well as light sensors that detect an amount of light incident on the electronic device 100. These features will be shown below.

When the enclosure 102 is formed from a metal, some parts of the enclosure 102 may undergo a machining operation to remove the metal, and a non-metal may fill the void in the enclosure 102 left from the machining operation. For example, the enclosure 102 may include a sidewall 114a having an opening, or window, that opens into the internal volume of the electronic device 100, and a non-metal material 116a that fills the opening. The non-metal material 116a may include plastic, resin, and/or adhesives. In this manner, the electronic device 100 may include components, such as an inductive charging unit and antennae (not shown in FIG. 1), positioned in the internal volume along the non-metal material 116a. The non-metal material 116a provides minimal, if any, blockage of radio frequency ("RF") communication to and from the antennae. Accordingly, the non-metal material 116a may be referred to as a radio frequency window. Further, the non-metal material 116a provides minimal, if any, blockage of induced electrical current from the inductive charging unit. As a result, the inductive charging unit can be used to charge an object or an accessory, such as a digital stylus, that is used to provide a touch input to the display assembly 104. These features will be shown below.

The enclosure 102 may further include through holes, or openings, that lead to the internal volume. For example, the sidewall 114b may include through holes 118a and through holes 118b. The through holes 118a and the through holes 118b may be used to allow acoustical energy generated by audio modules (not shown in FIG. 1) to exit the electronic device 100. Also, at least some of the through holes 118a and the through holes 118b may be used to receive acoustical energy, thereby allowing a microphone(s) (not shown in FIG. 1) in the electronic device 100 to process the acoustical energy. Although a discrete number of through holes are shown in the sidewall 114b, the number of through holes may vary. The electronic device 100 may include a connector 120 located in a through hole of the sidewall 114b. The connector 120 may electrically couple with a central processing unit (not shown in FIG. 1) on a circuit board in the internal volume, as well as a battery (or batteries, not shown) in the internal volume. In this manner, the electronic device 100 may receive and transmit data for the central processing unit, and may also receive electrical energy use to charge and re-charge the battery (or batteries). The connector 120 may include a Universal Serial Bus ("USB") connector, including a connector with USB-C protocol. However, the connector 120 may take the form of other standardized connectors.

Also, the electronic device 100 may include an input mechanism 122a located on the sidewall 114a. In some embodiments, the input mechanism 122a is a switch or a button mechanically coupled to an internal switch. The input mechanism 122a may be designed for actuation (such as a depression or lateral movement) to generate a command to alter the display assembly 104 or provide some other function, such as controlling the volume of the audio modules (not shown in FIG. 1). Although the input mechanism 122a is located on the sidewall 114a, other locations (both on the sidewall 114a and other sidewalls) are possible.

Figure 2:
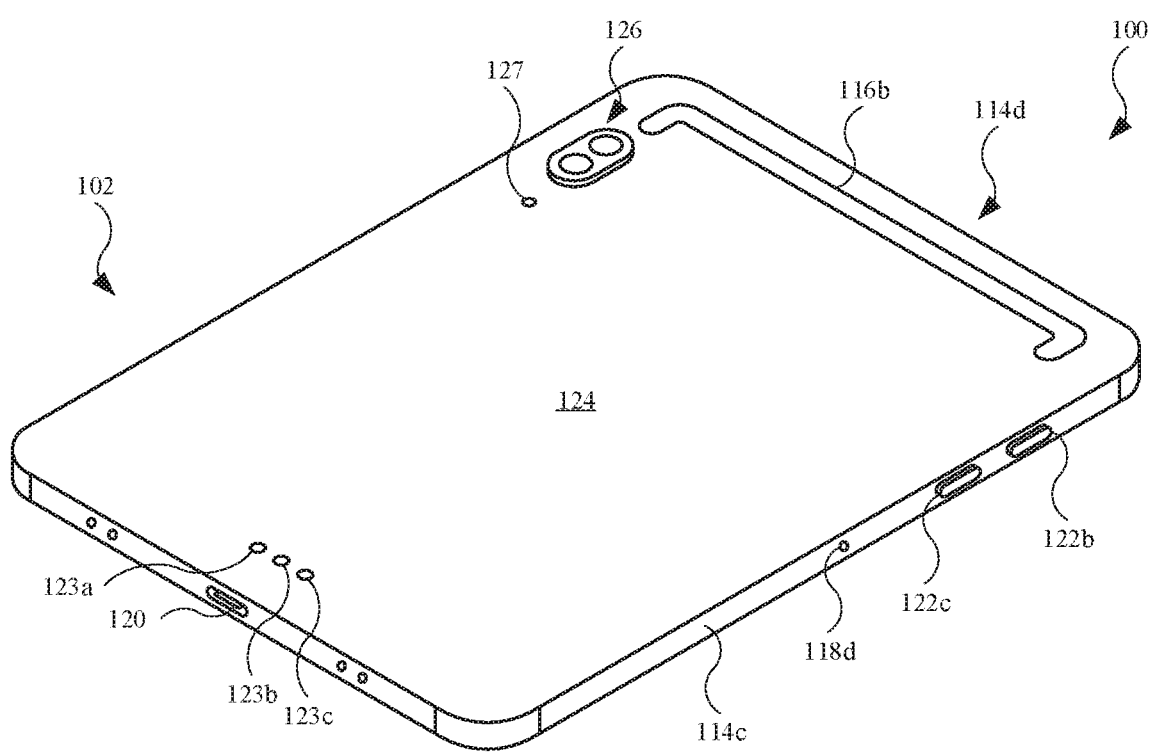
FIG. 2 illustrates an isometric back view of the electronic device shown in FIG. 1, showing additional features of the electronic device.

FIG. 2 illustrates an isometric back view of the electronic device 100 shown in FIG. 1, showing additional features of the electronic device 100. The enclosure 102 may include a wall 124, also referred to as a bottom wall or back wall, with several openings to allow for additional features. For example, the wall 124 may include an opening filled with a non-metal material 116b. The non-metal material 116b may include plastic, resin, and/or adhesives, as non-limiting examples. In this manner, the wall 124 may permit radio frequency into and out of the enclosure 102 by way of the non-metal material 116b. The wall 124 may further include openings for a camera assembly 126, a flash module 127, and a microphone (not labeled).

The enclosure 102 may further include a sidewall 114c that includes an opening 118d for a microphone (shown later). The sidewall 114c may further include an input mechanism 122b and an input mechanism 122c, both of which may include any feature previously described for the input mechanism 122a (shown in FIG. 1). Also, the enclosure 102 may include a sidewall 114d having through holes (not shown in FIG. 2) similar to the through holes 118a and the through holes 118b (shown in FIG. 1). In some instances, the sidewall 114d may include additional openings for an additional microphone(s).

In addition to the connector 120, other features can place the electronic device 100 in communication with external devices. For example, the electronic device 100 may include an electrical contact 123a, an electrical contact 123b, and an electrical contact 123c. The electrical contact 123a, the electrical contact 123b, and the electrical contact 123c may include metal contacts designed to electrically couple with an accessory device (not shown in FIG. 2), such as a cover, a folio, and/or a cover-keyboard accessory.

Figure 3:
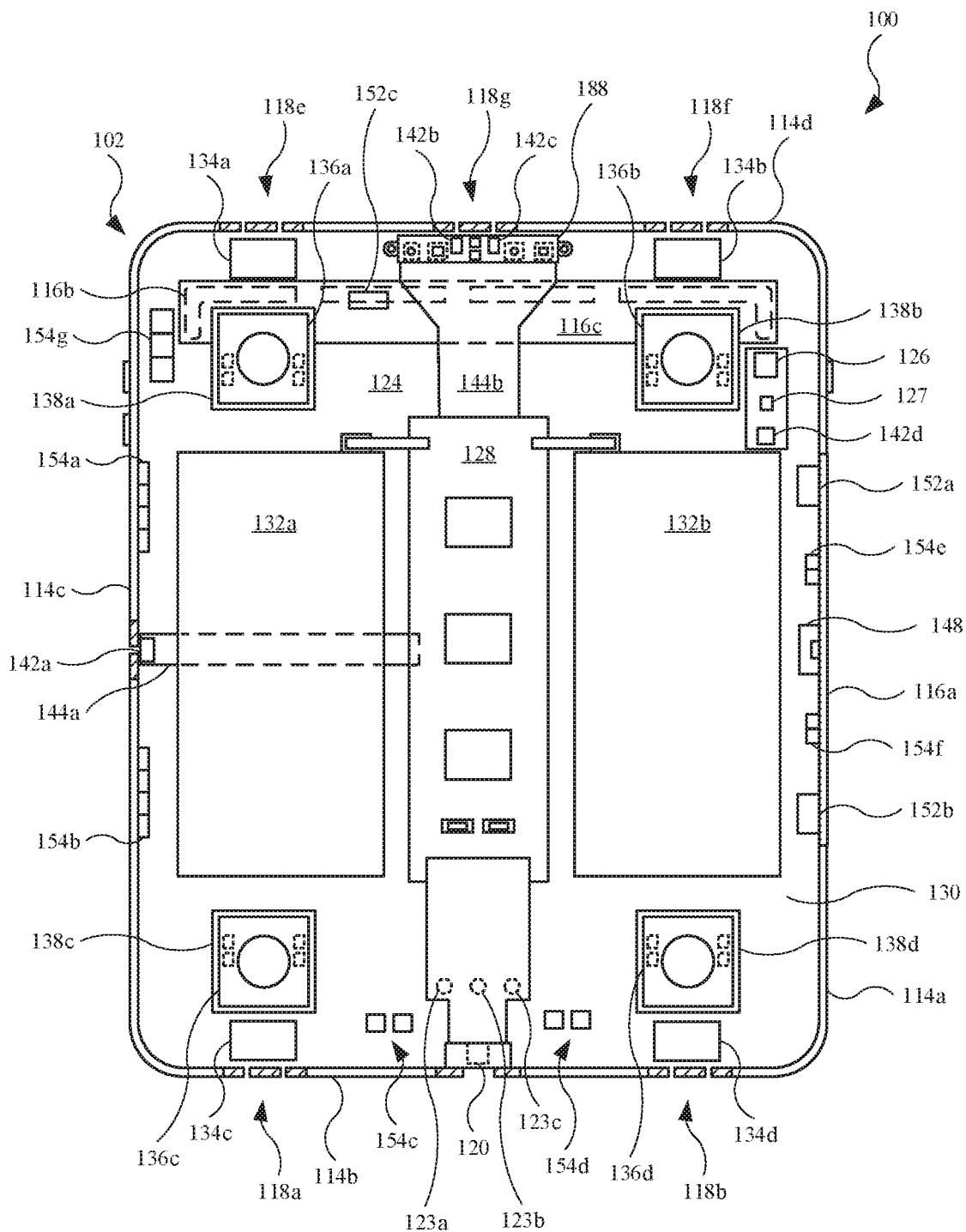
FIG. 3 illustrates a plan view of the electronic device, with the transparent cover and the display assembly removed to show additional features.

FIG. 3 illustrates a plan view of the electronic device 100, with the transparent cover 106 and the display assembly 104 removed to show additional features. As shown, the enclosure 102 may define an internal volume 130 that provides a space to carry the components of the electronic device 100. The electronic device 100 may include a circuit board 128 that carries several processor circuits (not labeled), some of which may serve as a central processing unit, a graphics processing unit, and a memory circuit, as non-limiting examples. The electronic device 100 may further include a battery module 132a and a battery module 132b that surround (and electrically couple to) the circuit board 128. The battery module 132a and the battery module 132b are designed to store and provide energy to the various operational components of the electronic device 100. Also, the battery module 132a and the battery module 132b can be charged using the connector 120.

The electronic device 100 may include a non-metal material 116c that is engaged (and in some cases, interlocked) with the non-metal material 116b. The non-metal material 116b (shown as dotted lines) may provide an aesthetic finish to the enclosure 102, while the non-metal material 116c provides a rigid material to add support to the enclosure 102.

The electronic device 100 may include several audio modules in the internal volume 130 of the enclosure 102. For example, the electronic device 100 may include an audio module 134a and an audio module 136a. In some embodiments, the audio module 134a is designed to generate acoustical energy, in the form of audible sound, approximately in the range of 2,000-20,000 Hertz ("Hz"), but in some case the range may be higher than 20,000 Hz. In some embodiments, the audio module 136a is designed to generate acoustical energy, in the form of audible sound, approximately in the range of 20-5,000 Hz. In this regard, the audio module 134a may be referred to as a tweeter, and the audio module 136a may be referred to as a woofer.

While both the audio module 134a and the audio module 136a may be secured (including adhesively secured) with the wall 124, the audio module 136a may secure with internal walls 138a that extends from the wall 124. The internal walls 138a may be integrally formed with the wall 124. In other words, the enclosure 102 may be formed from a block of material that undergoes a machining operation such that the wall 124 and the internal walls 138a are formed as a continuous structure. As shown in FIG. 3, the internal walls 138a are positioned between the sidewalls of the enclosure 102. The electronic device 100 may further include additional audio modules, including an audio module 134b, an audio module 134c, and an audio module 134d, that include similar features described for the audio module 134a. Also, the electronic device 100 may further include additional audio modules, including an audio module 136b, an audio module 136c, and an audio module 136d, that include similar features described for the audio module 136a, with the audio module 136b, the audio module 136c, and the audio module 136d secured with internal walls 138b, internal walls 138c, and internal walls 138d, respectively.

A partial cross section of the sidewalls of the enclosure 102 show several through holes positioned by the audio modules that allow acoustical energy to exit the electronic device 100. For example, the through holes 118a and the through holes 118b in the sidewall 114b allow acoustical energy in the audio module 134c and the audio module 134d, respectively, to exit the electronic device 100. The sidewall 114d includes through holes 118e and through holes 118f that serve a similar function for the audio module 134a and the audio module 134b, respectively. The remaining audio modules—the audio module 136a, the audio module 136b, the audio module 136c, and the audio module 136d—are designed to acoustically drive the wall 124 such that the wall 124 resonates and create sound. This will be further shown below. In this regard, some audio modules may generate acoustical energy by driving air throughout the internal volume 130, and may not rely upon the aforementioned through holes in the sidewalls. However, it should be noted that some acoustical energy from the audio module 136a, the audio module 136b, the audio module 136c, and/or the audio module 136d may exit a through hole(s). It should be noted that while a discrete number of audio modules (eight) are shown, the electronic device 100 may include a different number of audio modules in other embodiments (not shown).

The electronic device 100 may further include several microphones. For example, the electronic device 100 may include a microphone 142a secured with the sidewall 114c. The electronic device 100 may include a flexible circuit 144a that carries the microphone 142a. The flexible circuit 144a may electrically couple to the circuit board 128. As shown, the flexible circuit 144a may be routed under the battery module 132a and positioned against the sidewall 114c.

The electronic device 100 may further include a microphone 142b and a microphone 142c. The sidewall 114d includes through holes 118g for the microphone 142b and the microphone 142c to receive acoustical energy. The electronic device 100 may include a bracket 188 that carries a vision system (not labeled), as well as the microphone 142b and the microphone 142c. The vision system, and its components, will be further discussed below. The electronic device 100 may further include a flexible circuit 144b that electrically couples with the circuit board 128, the microphone 142b, the microphone 142c, and the components of the vision system. The flexible circuit 144b may also electrically couple to additional sensors that will be discussed below. The electronic device 100 may further include a microphone 142d. In some embodiments, the microphone 142d may be integrated with a camera assembly 126 and the flash module 127.

The electronic device 100 may further include an inductive charging unit 148. The inductive charging unit 148 may include a ferrite coil designed to receive an alternating electrical current from at least one of the battery module 132a or the battery module 132b. The direct current ("DC") provided by the battery module 132a and/or the battery module 132b may pass through an inverter (not shown in FIG. 3) to generate the alternating electrical current. As a result, the inductive charging unit 148 can subsequently provide an alternating electromagnetic field (not shown in FIG. 3) and act as a transmitter coil to inductively charge a power source (not shown in FIG. 3) of an object that is external to the electronic device 100. Further, the inductive charging unit 148 is aligned with the non-metal material 116a and the electromagnetic field generated by the inductive charging unit 148 may pass through the non-metal material 116a and induce electrical current into an object (not shown in FIG. 3), such as a digital stylus positioned against the sidewall 114a. This will be shown below.

The electronic device 100 may include an antenna 152a and an antenna 152b located along the non-metal material 116a. The electronic device 100 may further include an antenna 152c located along the non-metal material 116a and the non-metal material 116b. The antenna 152a, the antenna 152b, and the antenna 152c may enable wireless communication. Further, each antenna may provide radio frequency communication within a specific range of frequencies. For instance, the antenna 152a may provide Wi-Fi communication, the antenna 152b may provide Bluetooth® communication, and the antenna 152c may provide cellular network communication, each of which are commonly to known to those skilled in the art to transmit within a given range of frequencies. It should be noted other combinations of wireless communication are possible, and the location of the antenna 152a, the antenna, and the antenna 152c may be interchanged.

The electronic device 100 may further include several magnetic elements positioned in the internal volume 130. The magnetics elements may refer to permanent magnets or other magnetically attractable materials. The magnetic elements shown and described in FIG. 3 may refer to a group or set of magnetic elements, or may include an individual magnetic element.

The electronic device 100 may include magnetic elements 154a and magnetic elements 154b positioned along the sidewall 114c. The magnetic elements 154a and magnetic elements 154b are designed to magnetically couple with magnetic elements in an accessory device (not shown in FIG. 3), such as a cover, a folio, or a cover-keyboard accessory. Further, the magnetic elements 154a and magnetic elements 154b may position the electronic device 100 in a manner such that the sidewall 114c defines a base for the electronic device 100.

The electronic device 100 may include magnetic elements 154c and magnetic elements 154c positioned along the wall 124. The magnetic elements 154c and magnetic elements 154d are designed to support the electrical contact 123a and the electrical contact 123b. For example, when the electronic device 100 is coupled to an accessory device (not shown in FIG. 3) with electrical contacts that engage the electrical contact 123a, the electrical contact 123b, and the electrical contact 123c, the magnetic elements 154c and magnetic elements 154d may apply a repulsive magnetic force to magnetic elements in the accessory device. The repulsive magnetic force may repel the accessory device in a manner that reduces the amount of force or pressure applied to the electrical contact 123a, the electrical contact 123b, and the electrical contact 123c.

The electronic device 100 may include magnetic elements 154e and magnetic elements 154f positioned along the sidewall 114a, and in particular, along the non-metal material 116a. The magnetic elements 154e and magnetic elements 154f are designed to magnetically couple with magnets in the object that can be positioned against the sidewall 114a and inductively charged by the inductive charging unit 148. For example, a digital stylus (not shown in FIG. 3) may include magnets that magnetically couple with the magnetic elements 154e and magnetic elements 154f such that the digital stylus is retained by the electronic device 100 during an inductive charging event. Also, the magnetic elements 154e and magnetic elements 154f can be used to generally store the digital stylus against the sidewall 114a.

The electronic device 100 may further include magnetic elements 154g designed to magnetically couple with magnets of an accessory device (not shown in FIG. 3) designed to cover the electronic device 100. The electronic device 100 may further include several magnetic elements positioned within some of the audio modules. For example, the electronic device 100 may include magnetic elements (not labeled, shown as dotted lines) covered by the audio module 136a, the audio module 136b, the audio module 136c, and the audio module 136d. The magnetic elements covered by the aforementioned audio modules located along the wall 124 and between their respective internal walls are designed to magnetically couple with magnets in an accessory device (not shown in FIG. 3) in order to hold the accessory device against the wall 124. Also, the audio module 136a, the audio module 136b, the audio module 136c, and the audio module 136d may include integrated magnets (including a permanent magnet) separate from the aforementioned magnetic elements that are shown as dotted lines. The magnets that are integrated with the audio modules are used to produce acoustical energy. In order to promote installation of the audio module 136a, the audio module 136b, the audio module 136c, and the audio module 136d with their respective internal walls, the magnets of the audio module 136a, the audio module 136b, the audio module 136c, and the audio module 136d may include an opposing magnetic polarity as that of the magnetic elements (shown as dotted lines). This may provide a magnetic attraction force and/or limit or prevent a magnetic repulsion force.

Figure 4:
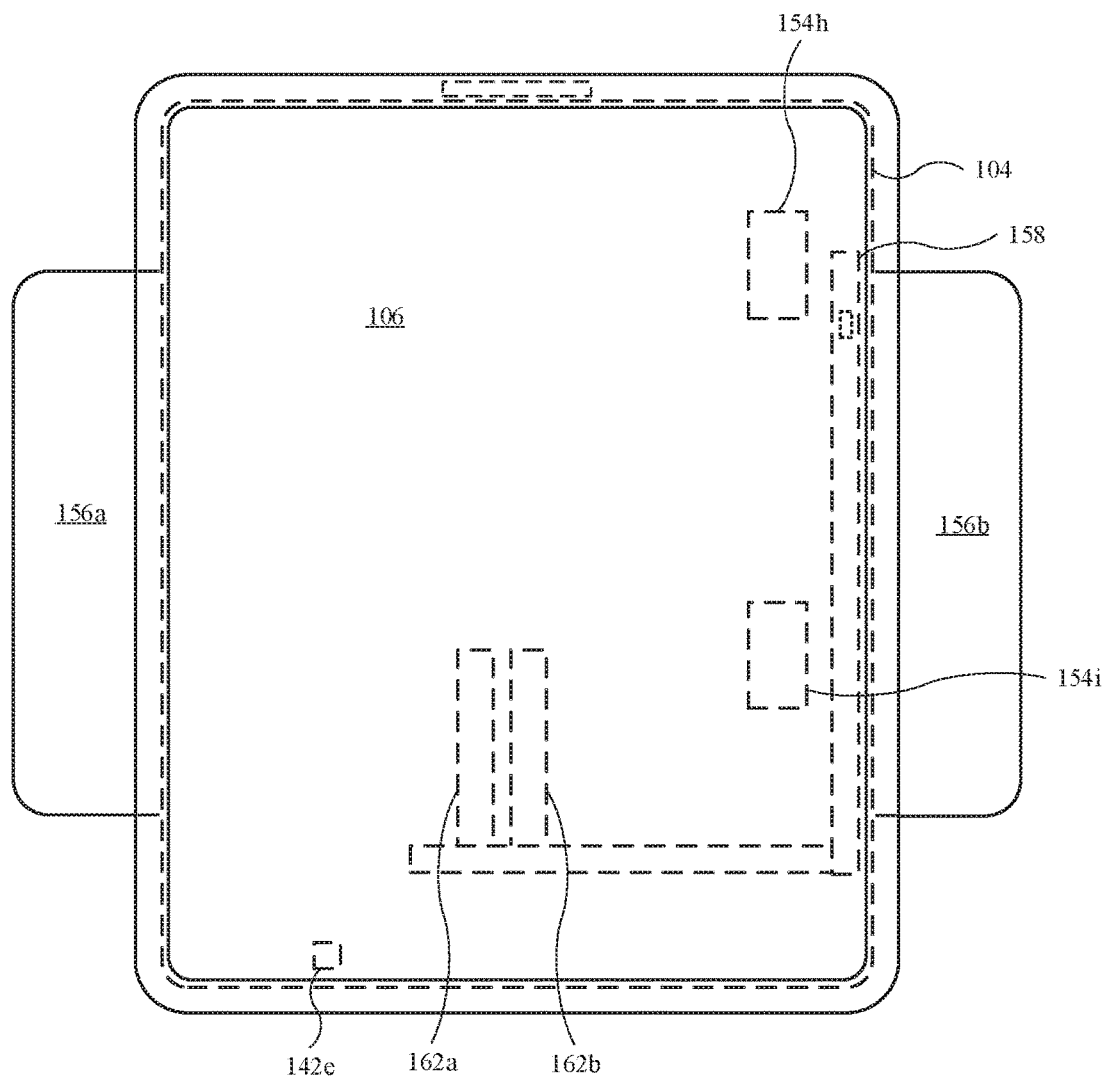
FIG. 4 illustrates a plan view of the transparent cover and the display assembly, further showing several circuits used in conjunction with the display assembly.

FIG. 4 illustrates a plan view of the transparent cover 106 and the display assembly 104, further showing several circuits used in conjunction with the display assembly 104. The display assembly 104 may include a flexible circuit 156a extending from one end of the display assembly 104, and a flexible circuit 156b extending from another (opposing) end of the display assembly 104. In particular, the flexible circuit 156a and the flexible circuit 156b may extend from opposing ends of a touch input layer (not shown in FIG. 4) of the display assembly 104. The flexible circuit 156a and the flexible circuit 156b may wrap around and electrically connect to the circuit board 128 (shown in FIG. 3). Also, a circuit board 158 (shown as a dotted line) may couple with the display assembly 104. The circuit board 158 may include a timing controller board designed to drive the display assembly 104. The circuit board 158 may include a flexible circuit 162a and a flexible circuit 162b (shown as dotted lines), both which electrically connect to the circuit board 128 (shown in FIG. 3).

The display assembly 104, or a metal chassis (not shown in FIG. 4) that is coupled to the display assembly 104, may carry additional structures and components. For example, a magnetic element 154h and a magnetic element 154i may couple with the display assembly 104 (or the aforementioned metal chassis). The magnetic element 154h and the magnetic element 154i may magnetically couple with an accessory device (not shown in FIG. 4) designed to overlay and protect the transparent cover 106 and the display assembly 104. Also, a microphone 142e may couple with the display assembly 104. The microphone 142e may utilize the through holes 118a (shown in FIG. 3) to receive acoustical energy.

Figure 5:
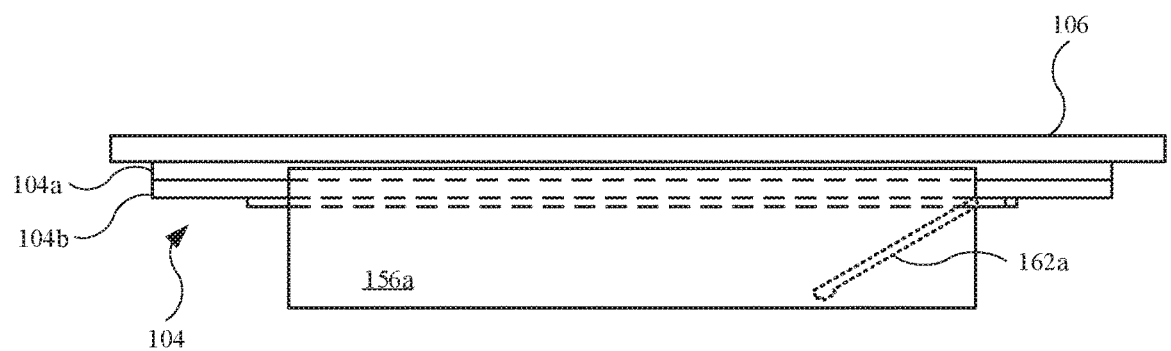
FIG. 5 illustrates a side view of the transparent cover and the display assembly shown in FIG. 4.

FIG. 5 illustrates a side view of the transparent cover 106 and the display assembly 104 shown in FIG. 4. As shown, the display assembly 104 may include a touch input layer 104a coupled to the transparent cover 106. The display assembly 104 may further include a display layer 104b coupled to the touch input layer 104a. The coupling means may include adhesives (not shown in FIG. 5). The flexible circuit 156a may extend from the touch input layer 104a and wrap around the display layer 104b to electrically connect to the circuit board 128 (shown in FIG. 3). The flexible circuit 162a and the flexible circuit 162b (not shown in FIG. 5) may extend from the display layer 104b to electrically connect to the circuit board 128 (shown in FIG. 3).

Figure 6:
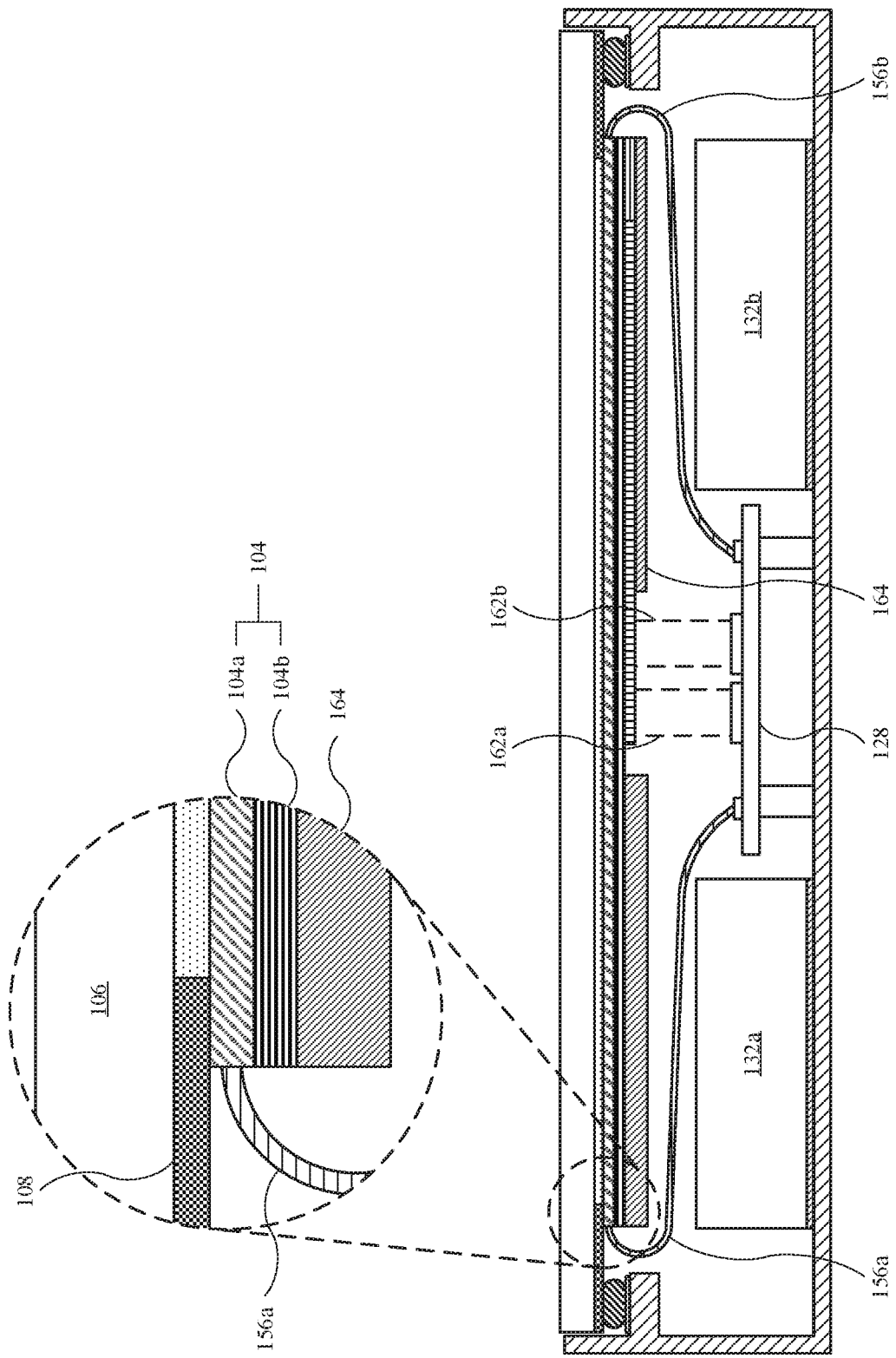
FIG. 6 illustrates a cross sectional view of the electronic device, showing various electrical connections between the display assembly and the circuit board.

FIG. 6 illustrates a cross sectional view of the electronic device 100, showing various electrical connections between the display assembly 104 and the circuit board 128. As shown, the flexible circuit 156a and the flexible circuit 156b wrap around and pass over the battery module 132a and the battery module 132b, respectively, and electrically and mechanically couple to the circuit board 128 to place the touch input layer 104a in communication with the circuit board 128 as well as any processor circuits (not shown in FIG. 6) coupled to the circuit board 128. Also, the flexible circuit 162a and the flexible circuit 162b (both shown as dotted lines, as they are out of plane) electrically and mechanically couple to the circuit board 128 to place the display layer 104b and the circuit board 158 (shown in FIG. 4) in communication with the circuit board 128 as well as any processor circuits (not shown in FIG. 6) coupled to the circuit board 128. As shown in the enlarged view, the border 108 may cover the edges of the display assembly 104, as well as electrical connections to the touch input layer 104a and the display layer 104b. As a result, the display layer 104b of the display assembly 104 may illuminate and present visual information, which may be viewable except for at the border 108, and the electrical connects are obscured by the border 108. Also, in order to protect the display assembly 104, a chassis 164 can couple with the display assembly 104. The chassis 164 may include a metal chassis.

Figure 7:
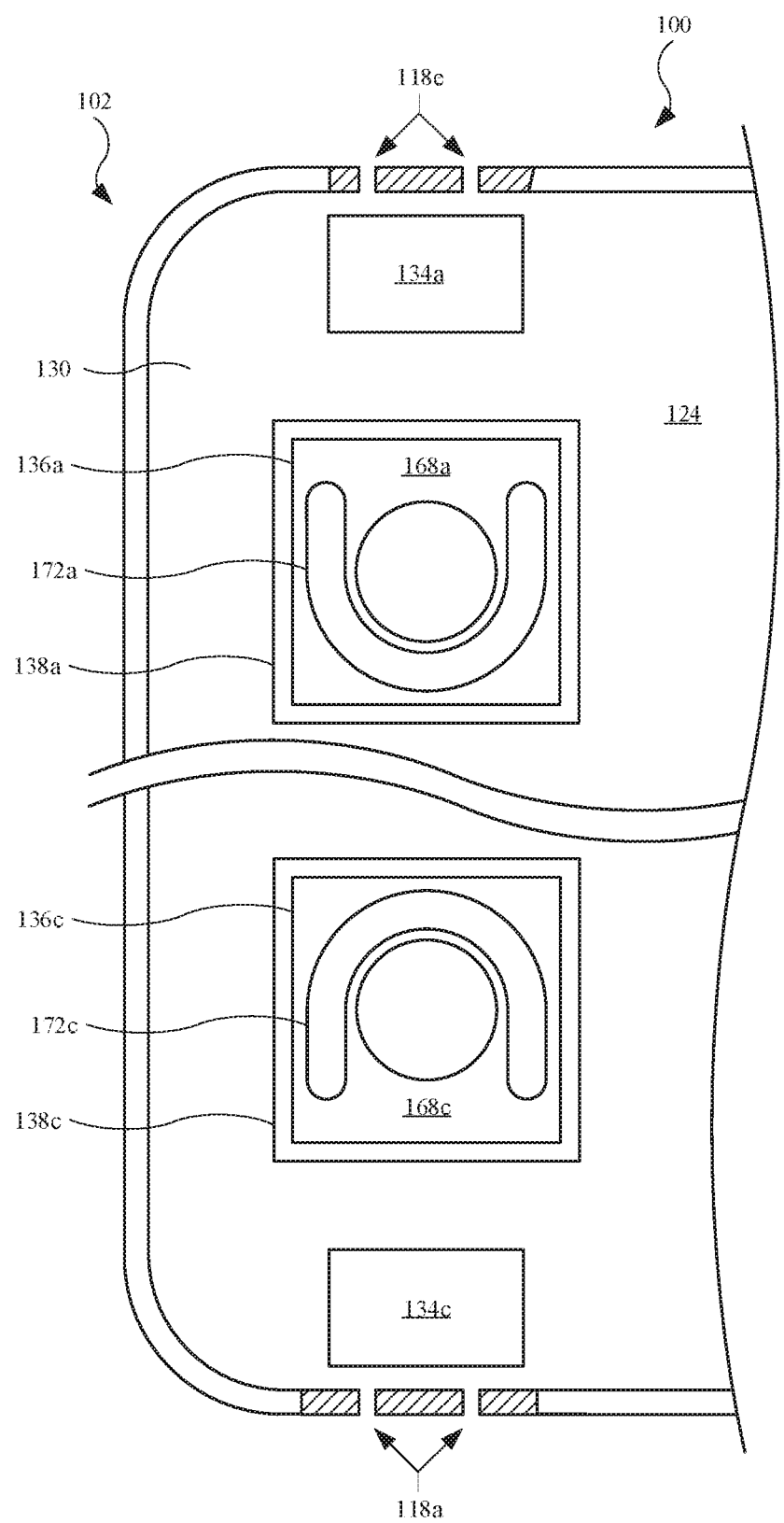
FIG. 7 illustrates a plan view of the electronic device, showing several audio modules positioned in the enclosure.

FIG. 7 illustrates a plan view of the electronic device 100, showing several audio modules positioned in the enclosure 102. As shown, the audio module 136a may include a cover 168a that connects to the internal walls 138a. The cover 168a may include a metal, such as stainless steel (including SUS stainless steel). However, other metals and non-metals (such as carbon fiber) are possible. When the audio module 136a generates acoustical energy, the audio module 136a causes acoustical vibration of the wall 124 and drives air throughout the internal volume 130. Further, the cover 168a may include a raised portion 172a that can direct at least some of the driven air around the audio module 134a and in a direction toward the through holes 118e, shown by a partial cross section of the enclosure 102. Similarly, the audio module 136c may include a cover 168c that connects to the internal walls 138a. When the audio module 136c generates acoustical energy, the audio module 136c causes acoustical vibration of the wall 124 and drives air throughout the internal volume 130. Further, the cover 168c may include a raised portion 172c that can direct at least some of the driven air around audio module 134c and in a direction toward the through holes 118a, shown by a partial cross section of the enclosure 102. Additional audio modules (including the audio module 136b and the audio module 136d, shown in FIG. 3) may include features and properties similar to those described for the audio module 136a and the audio module 136c.

Figure 8A:
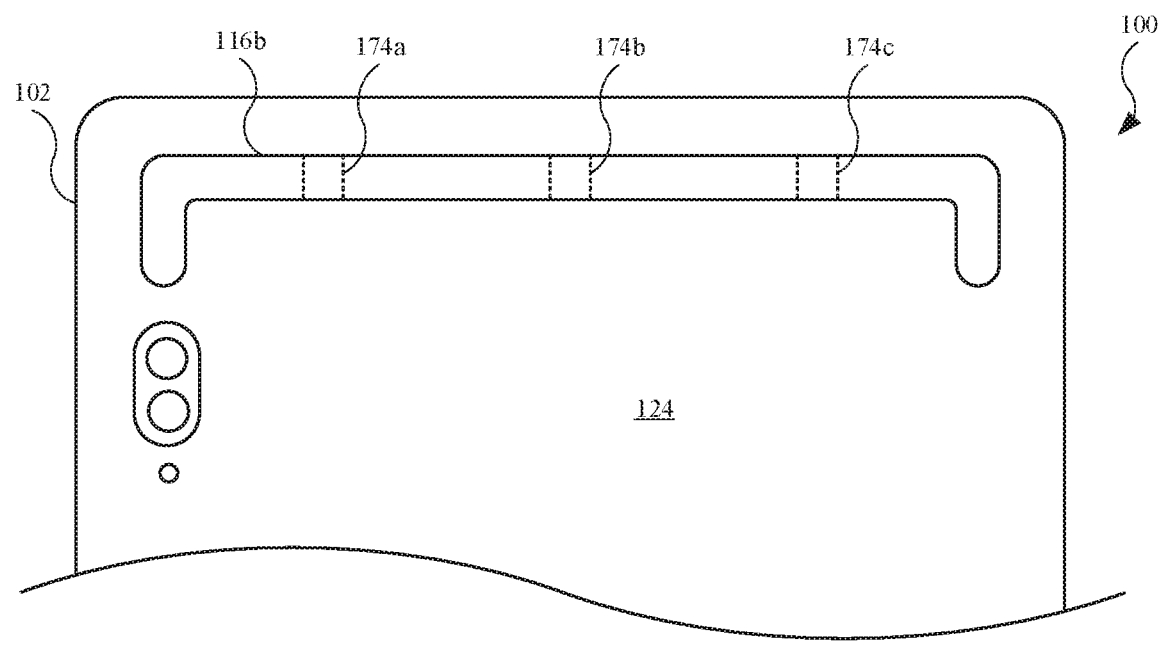
FIG. 8A illustrates a plan view of the back of the electronic device, showing the non-metal material and multiple linked sections of the enclosure covered by the non-metal material.

FIG. 8A illustrates a plan view of the back of the electronic device 100, showing the non-metal material 116b and multiple linked sections of the enclosure 102 covered by the non-metal material 116b. When openings in the wall 124 are formed, the removed material from the enclosure 102 reduces the overall rigidity of the enclosure 102. However, during a material removal operation to form openings in the wall 124, a cutting tool (not shown) can be controlled such that a linked section 174a, a linked section 174b, and a linked section 174c remain after the material removal operation. The aforementioned linked sections act as bridges to retain at least some structural integrity of the enclosure 102 subsequent to a material removal operation. As a result, the enclosure 102 is less likely to warp or bend.

Figure 8B:
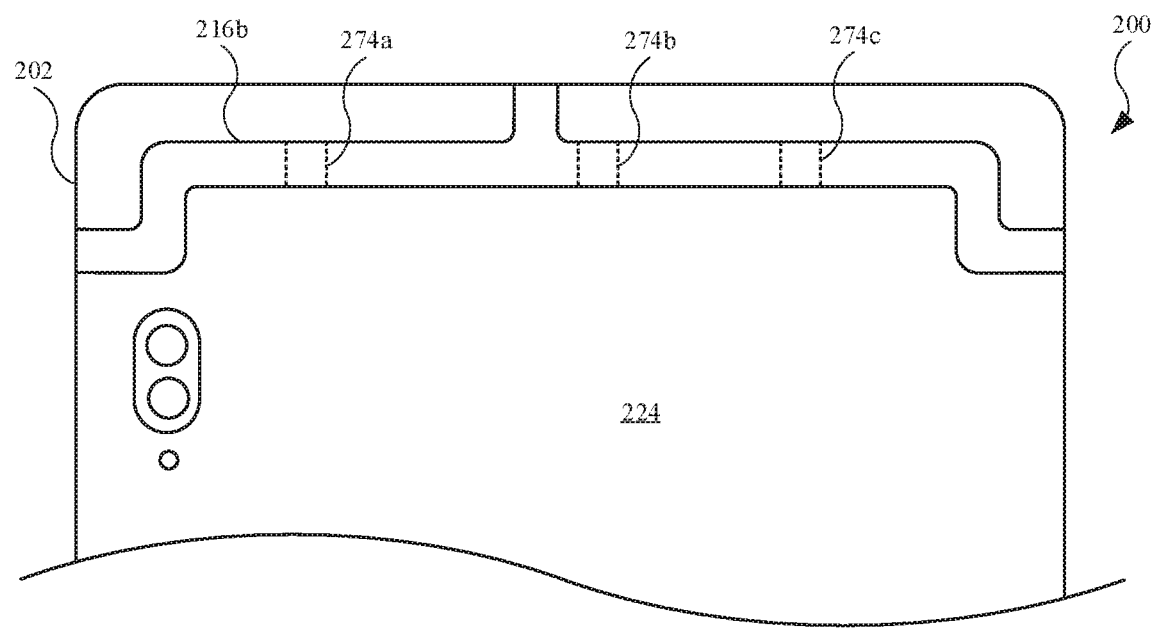
FIG. 8B illustrates an alternate embodiment of an electronic device, showing an alternate non-metal material that extends to the edges of the enclosure, in accordance with some described embodiments.

FIG. 8B illustrates an alternate embodiment of an electronic device 200, showing a non-metal material 216b that extends to the edges of an enclosure 202 of the electronic device 200, in accordance with some described embodiments. The electronic device 200 may include any features described herein for an electronic device, such as the electronic device 100 (shown in FIG. 1). A material removal operation may extend not only along a wall 224, but also to sidewalls (not shown in FIG. 8B) that are similar to the sidewall 114a and the sidewall 114b (shown in FIG. 1), as well as the sidewall 114d (shown in FIG. 3). The additional removed material may permit additional area for antennae and accordingly, additional area for radio frequency transmission through the enclosure 202 when, for example, the electronic device 200 includes a cellular network antenna and associated processing circuitry (not shown in FIG. 8B). However, the material removal operation to form the opening in the wall 224 can be controlled such that a linked section 274a, a linked section 274b, and a linked section 274c remain after the material removal operation.

Figure 9:
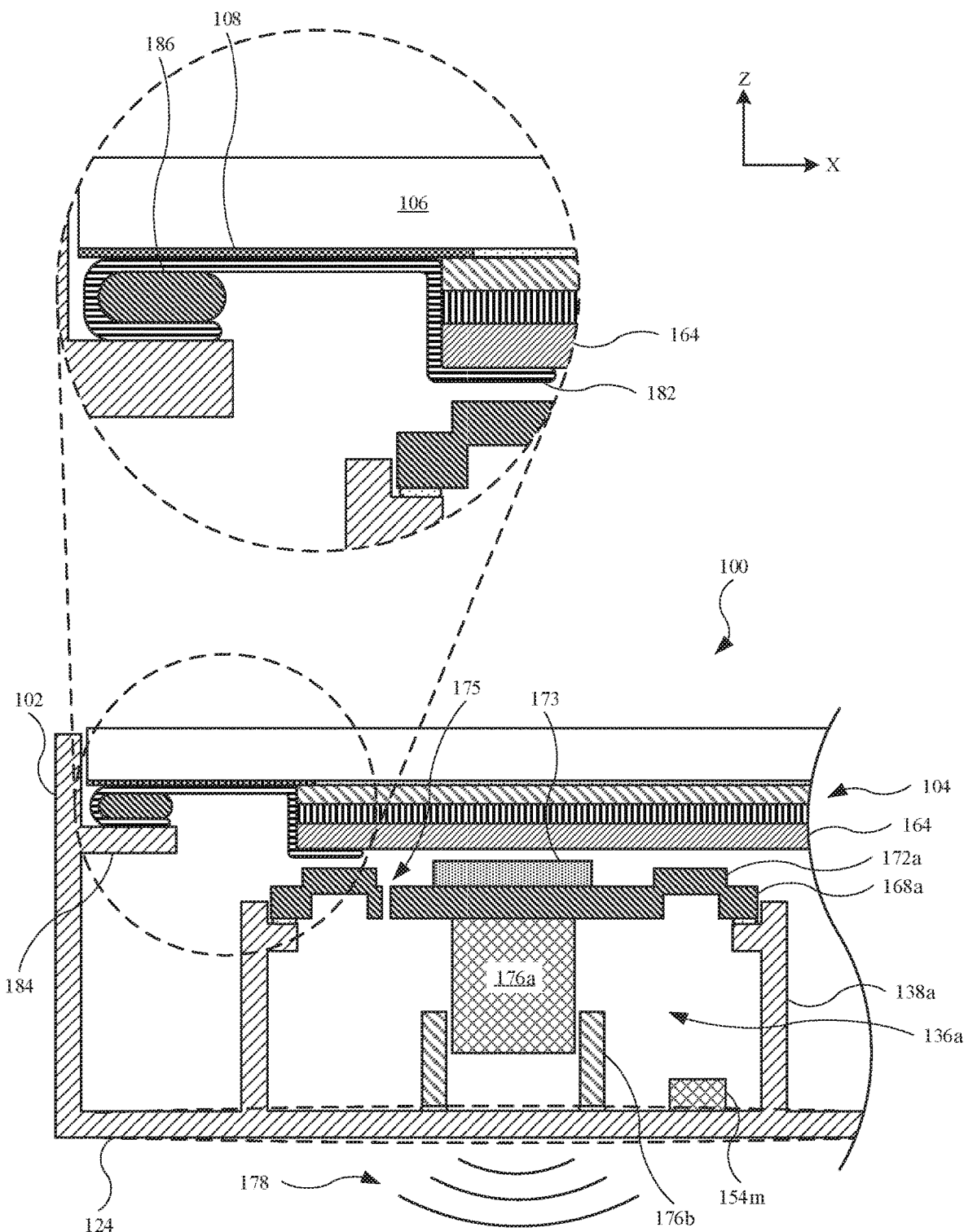
FIG. 9 illustrates a cross sectional view of the electronic device, showing the audio module generating acoustical energy.

FIG. 9 illustrates a cross sectional view of the electronic device 100, showing the audio module 136a generating acoustical energy. As shown, the cover 168a of the audio module 136a is adhesively secured to the internal walls 138a. The audio module 136a may include a magnetic element 176a coupled to the cover 168a. As shown, the raised portion 172a of the cover 168a creates a corresponding recessed portion. The corresponding recessed portion may be formed though an embossing operation to the cover 168a. Also, the corresponding recessed portion creates a path that can be used to direct air driven during use of the audio module 136a. Also, during use of the audio module 136a, the cover 168a may move relative to the internal walls 138a. However, the raised portion 172a may contact the chassis 164 and provide a buffer for the audio module 136a to prevent unwanted sound generation through contact with the chassis 164. Also, the audio module 136a may include a protective material 173, which may include compressible foam that further prevents unwanted sound generation through contact with the chassis 164. Also, the cover 168a may include an opening 175 (or multiple openings) that provides a vent that relieves air pressure within the space defined by the cover 168a and the internal walls 138a.

The audio module 136a may further include a magnetic element 176b adhesively secured to the wall 124. In some embodiments, the magnetic element 176a is a permanent magnet and the magnetic element 176b is an electromagnet that includes a coil designed to receive an alternating electrical current that causes an alternating magnetic polarity. The alternating magnetic polarity causes a magnetic attraction and magnetic repulsion between the magnetic element 176a and the magnetic element 176b, causing relative movement of the magnetic element 176b with respect to the magnetic element 176a. The relative movement may occur at a frequency in accordance with the frequency of the alternating current provided to the magnetic element 176b.

Due in part to the coupling between the magnetic element 176b and the wall 124, the wall 124 may move in conjunction with the movement of the magnetic element 176b. For example, the wall 124 may move toward and away from the magnetic element 176a accordance with the frequency of the alternating current provided to the magnetic element 176b, thereby causing the wall 124 to resonate and produce acoustical energy 178 in the form of audible sound. In other words, the wall 124 is acoustically driven by the audio module 136a. The remaining audio modules (such as the audio module 136b, the audio module 136c, and the audio module 136d) may operate in a similar manner.

When the display assembly 104 is assembled with the enclosure 102, the antenna 152c (shown in FIG. 3) may be sensitive to the chassis 164, as the chassis 164 may include metal and, as a result, may carry some electrostatic charge if not electrically grounded. In order to eliminate this issue, the chassis 164 may be electrically grounded. For example, an electrically conductive layer 182 may couple to the chassis 164 and the enclosure 102, including a ledge 184 of the enclosure 102 that receives the transparent cover 106. The electrically conductive layer 182 may include a copper adhesive, such as copper tape. Other metal-adhesive combinations are possible. In some instances, the electrically conductive layer 182 is secured to the ledge 184 by an electrically conductive adhesive (not shown in FIG. 9). Also, the electrically conductive layer 182 may adhesively secure to the transparent cover 106 and/or the border 108 by an adhesive (not shown in FIG. 9). Further, as shown in the enlarged view, a film 186, at least partially surrounded by the electrically conductive layer 182, may adhesively secure with the electrically conductive layer 182. In some embodiments, the film 186 is a heat-activated film designed to provide adhesive properties when heat and/or pressure is/are applied (to the film 186) by, for example, an assembly operation between the transparent cover 106 and the enclosure 102. The film 186 may include some compressive properties, which promotes positioning the transparent cover 106 along the Z-axis in a consistent and repeatable manner during assembly. The compressive properties may compensate for structural variances and tolerances in the components.

The electronic device 100 may further include magnetic elements 155m positioned between the internal walls 138a. Despite the proximity to the magnetic element 176a and the magnetic element 176b, the magnetic elements 155m may not interfere with the audio module 136a, and may couple with magnetic elements embedded in an accessory device (not shown in FIG. 9).

Figure 10:
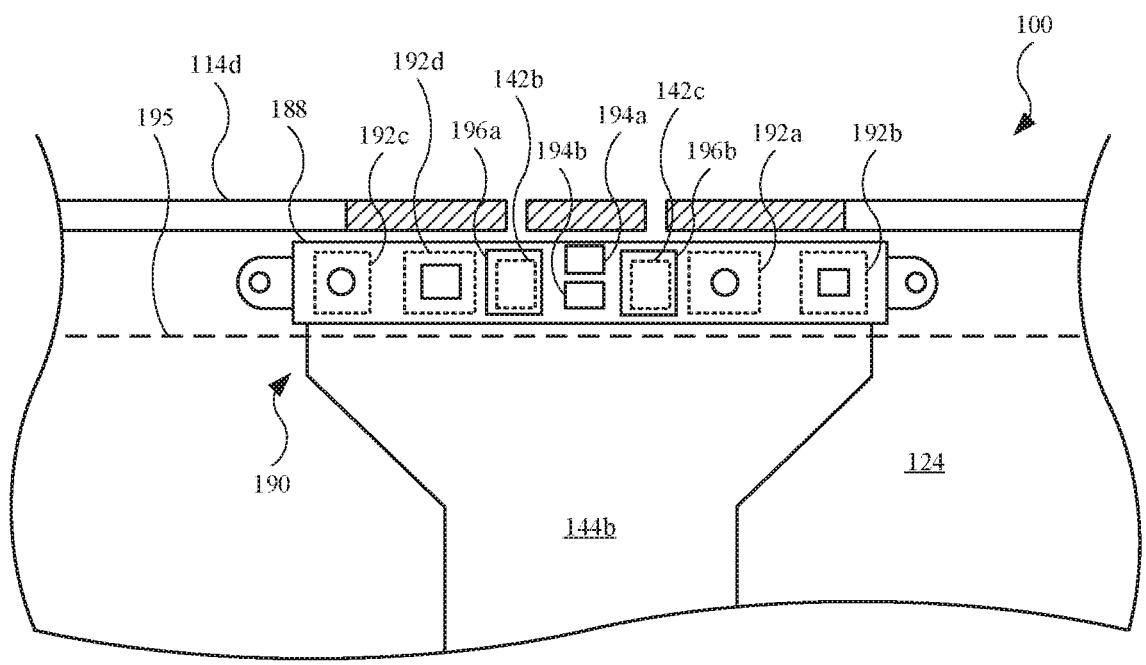
FIG. 10 illustrates an enlarged plan view of the electronic device, showing the vision system as well as additional components.

FIG. 10 illustrates an enlarged plan view of the electronic device 100, showing the vision system 190 as well as additional components. The transparent cover 106 and the display assembly 104 are removed to show the components. As shown, a bracket 188, which may include one or more bracket parts, carries the vision system 190. The bracket 188 may be secured (either adhesively and/or fastened) with the wall 124. The vision system 190 may electrically couple with the flexible circuit 144b, which is electrically coupled to the circuit board 128 (shown in FIG. 3).

The vision system 190 may include several components used for object recognition, including facial recognition. For example, the vision system 190 may include a camera module 192a designed to capture an image of an object. The vision system 190 may further include a first light-emitting module 192b designed to project a light pattern, including a pattern of laser light dots, onto the object. The first light-emitting module 192b may emit infrared ("IR") light. The vision system 190 may further include a light-receiving module 192c designed to receive at least some of the light pattern (generated by the first light-emitting module 192b) that is reflected from the object. To provide additional light when ambient light is relatively, the vision system 190 may further include a second light-emitting module 192d, which may also emit IR light. For purposes of safety, a filter (not shown in FIG. 10) may cover the second light-emitting module 192d. The components of the vision system 190 are positioned between the sidewall 114d and an imaginary line 195 (represented by a dotted line), which represents a position of the border 108 (shown in FIG. 1).

When used for facial recognition, the vision system 190 may be used to authenticate a user by comparing a prior saved (reflected) dot pattern of the user's face with a current (reflected) dot pattern of the user's face. A facial recognition software application (not shown in FIG. 10) may compare and authenticate if the current dot pattern is at or above a predetermined percent match with the saved dot pattern. When the user is authenticated using the facial recognition software application, the electronic device 100 may unlock and grant access to the user.

The bracket 188 may carry additional components. For example, the bracket 188 may carry the microphone 142b and the microphone 142c. In some instances, the microphone 142b and the microphone 142c are sensitive to light energy from one or more of the light-emitting modules of the vision system 190. In this manner, a light-blocking tape 196a and a light-blocking tape 196b may cover and shield the microphone 142b and the microphone 142c, respectively, from the light from the one or more light-emitting modules of the vision system 190. The bracket 188 may carry sensors, such as a sensor 194a and a sensor 194b. In some embodiments, the sensor 194a is a proximity sensor and the sensor 194b is an ambient light sensor. The vision system 190 may rely upon the sensor 194b to determine, based upon light intensity measured from the sensor 194b, when to activate the second light-emitting module 192d.

Figure 11:
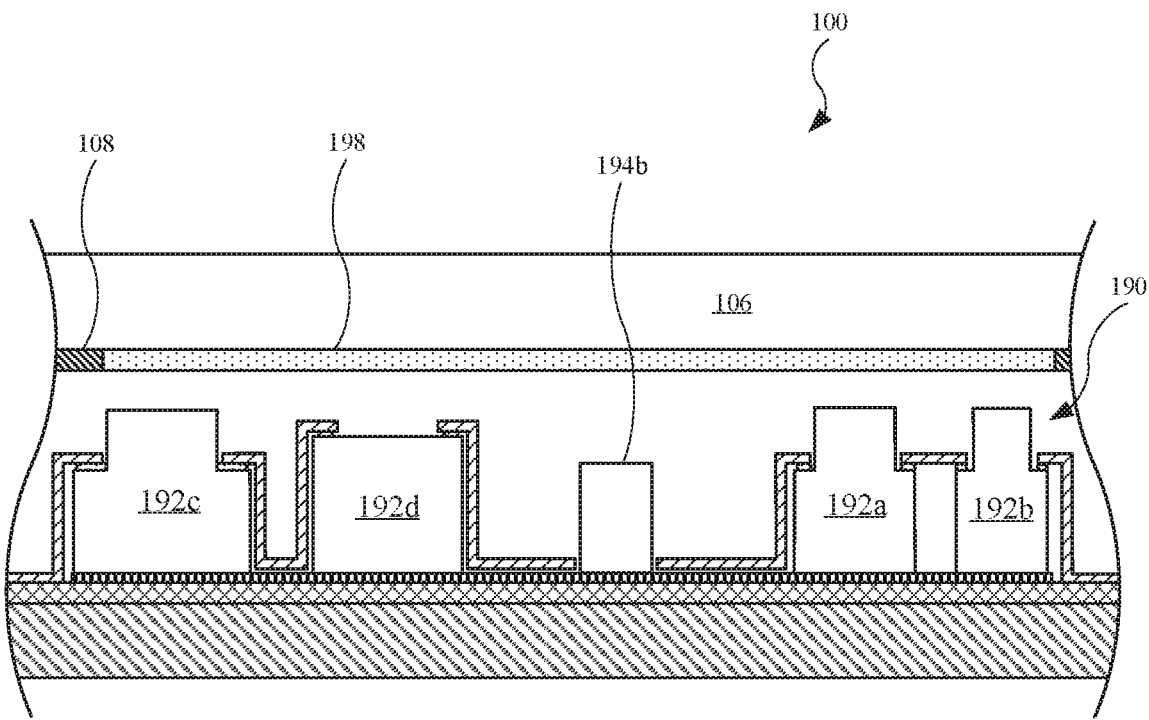
FIG. 11 illustrates a cross sectional view of the electronic device, showing the vision system and the components shown in FIG. 10, and further showing the border having openings with a material filling the openings of the border.

FIG. 11 illustrates a cross sectional view of the electronic device 100, showing the vision system 190 and the components shown in FIG. 10, and further showing the border 108 having openings with a material filling the openings of the border 108. As shown, the border 108 is secured to the transparent cover 106. The border 108 may include an opaque material, such as an opaque ink or paint. Also, the border 108 generally covers the vision system 190. In order for the vision system 190 to perform object recognition, the border 108 includes openings, or voids, to permit light transmission through the border 108. For example, the border 108 may include an opening with a material 198. The material 198 may include a translucent material, or a light transmitting material, such as translucent ink. Further, the material 198 may match, or may be substantially similar to, the appearance of the border 108 in terms of color and/or reflectivity. For example, when the border 108 is black, the material 198 appears black. Other appearances (e.g., color, reflectivity) are possible. This allows the border 108 to appear at least partially continuous, while the material 198 at least partially obscure the components of the vision system 190. The material 198 permits light to reach the camera module 192a and the light-receiving module 192c, and permits light from the first light-emitting module 192b and the second light-emitting module 192d to pass such that light exits the electronic device 100. The material 198 further permits light to reach the sensor 194b and the sensor 194a (not shown in FIG. 11).

Figure 12:
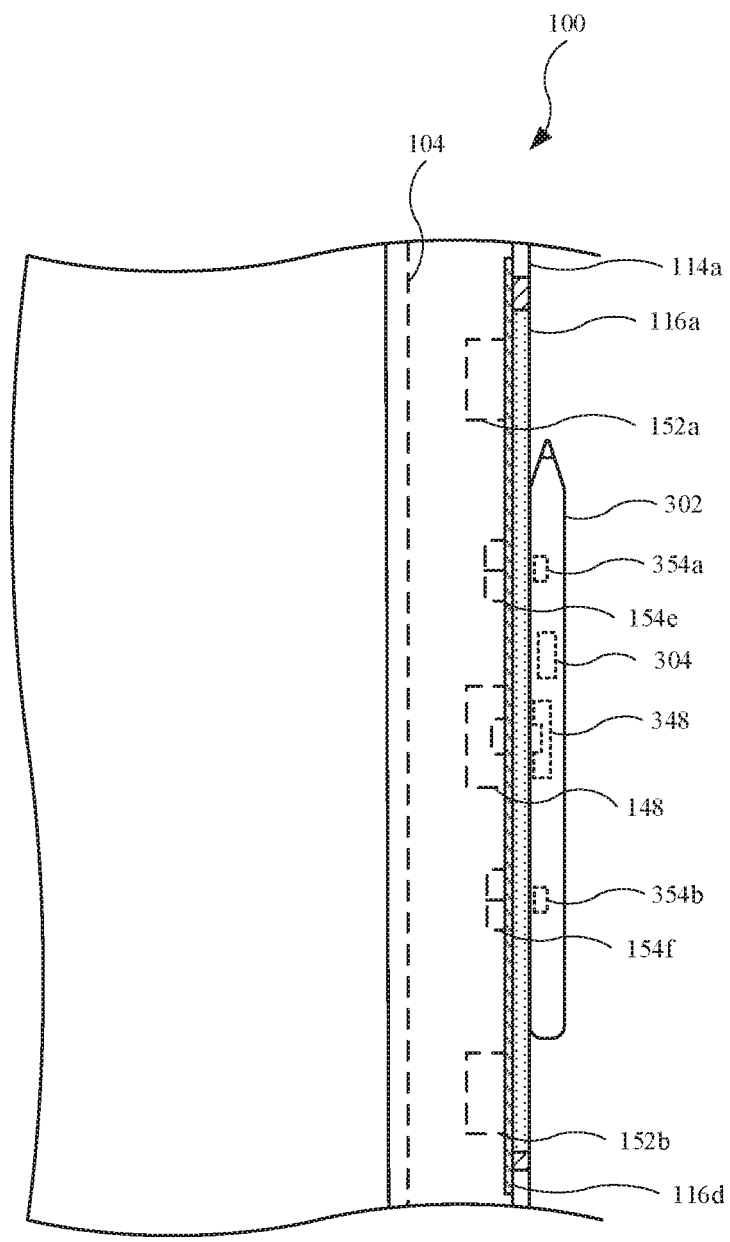
FIG. 12 illustrates a plan view of the electronic device, showing an object positioned against the sidewall.

FIG. 12 illustrates a plan view of the electronic device 100, showing an object 302 positioned against the sidewall 114a. The object 302 may include a digital stylus capable of interacting and providing an input to the display assembly 104, and in particular, the touch input layer (not shown in FIG. 12) of the display assembly 104. In order for the object 302 to function and change the electrostatic field of the touch input layer, the object 302 requires a battery 304 to supply electrical current to a capacitive component and to radio frequency components (not shown in FIG. 12) of the object 302, both of which may be used to communicate with the electronic device 100. The battery 304 of the object 302 may include a rechargeable battery.

The inductive charging unit 148 of the electronic device 100 is designed to charge the battery 304 of the object 302. The inductive charging unit 148 may act as transmitter coil and inductively charge the battery 304 by inducing an alternating current ("AC") to a receiver coil 348 of the object 302. The induced current may pass through an AC-to-DC converter, such as a rectifier, and may subsequently be used to charge or recharge the battery 304. To induce the current to the battery 304, the inductive charging unit 148 and the object 302 are positioned along the non-metal material 116a. An additional non-metal material 116d may be present to provide additional rigidity along the sidewall 114a. The additional non-metal material 116d may include a resin and/or a hardened adhesive. In order to maintain the object 302 against the sidewall 114a (or against the non-metal material 116a), the magnetic elements 154e and the magnetic elements 154f may magnetically couple with magnetic elements 354a and magnetic elements 354b, respectively, in the object 302. Also, as shown, the antenna 152a and the antenna 152b are positioned along the non-metal material 116a and the additional non-metal material 116d, thereby allowing the antenna 152a and the antenna 152b to send and receive RF communication.

Figure 13:
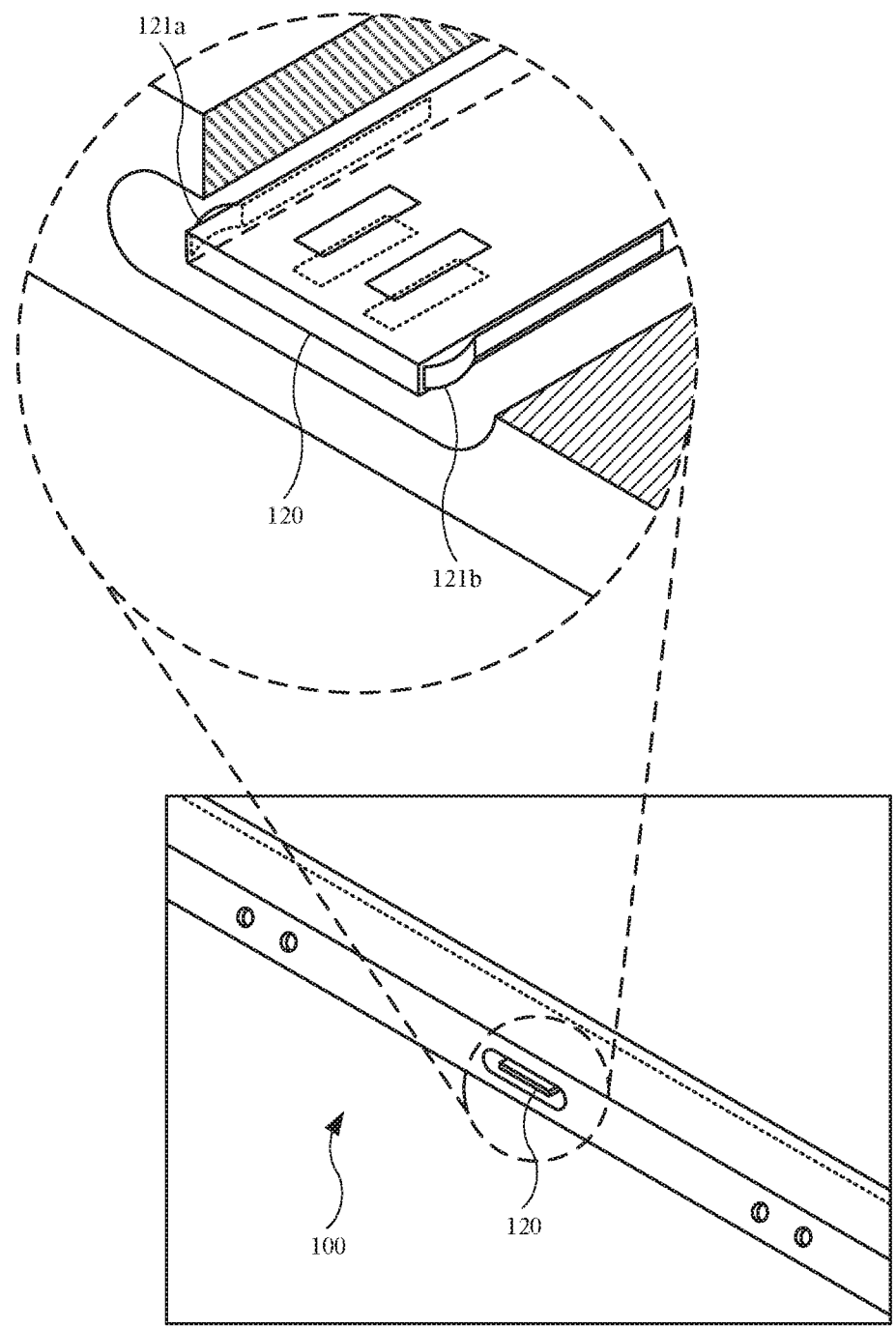
FIG. 13 illustrates a partial view of the electronic device, showing the connector and connector retaining elements along the connector.

FIG. 13 illustrates a partial view of the electronic device 100, showing the connector 120 and connector retaining elements along the connector 120. As shown in the enlarged view, the connector 120 may include a retainer element 121a and a retainer element 121b. The retainer element 121a and the retainer element 121b are designed to engage and retain an external connector (not shown in FIG. 13) of a cable assembly, thereby allowing the electronic device 100 to send and receive data, as well as receive electrical current to charge the battery modules (not shown in FIG. 13). The retainer element 121a and the retainer element 121b are further designed to protect and shield the connector 120. For example, the retainer element 121a and the retainer element 121b are designed prevent excessive contact with the connector 120 as a result of cycling (connecting and disconnecting) between the connector 120 and the external connector. This may prevent the connector 120 from unwanted wearing. The retainer element 121a and the retainer element 121b may be formed through injection molding, including metal injection molding. As a result, the retainer element 121a and the retainer element 121b may include metal. Also, the retainer element 121a and the retainer element 121b may be applied to the connector 120 by soldering.

Figure 14:
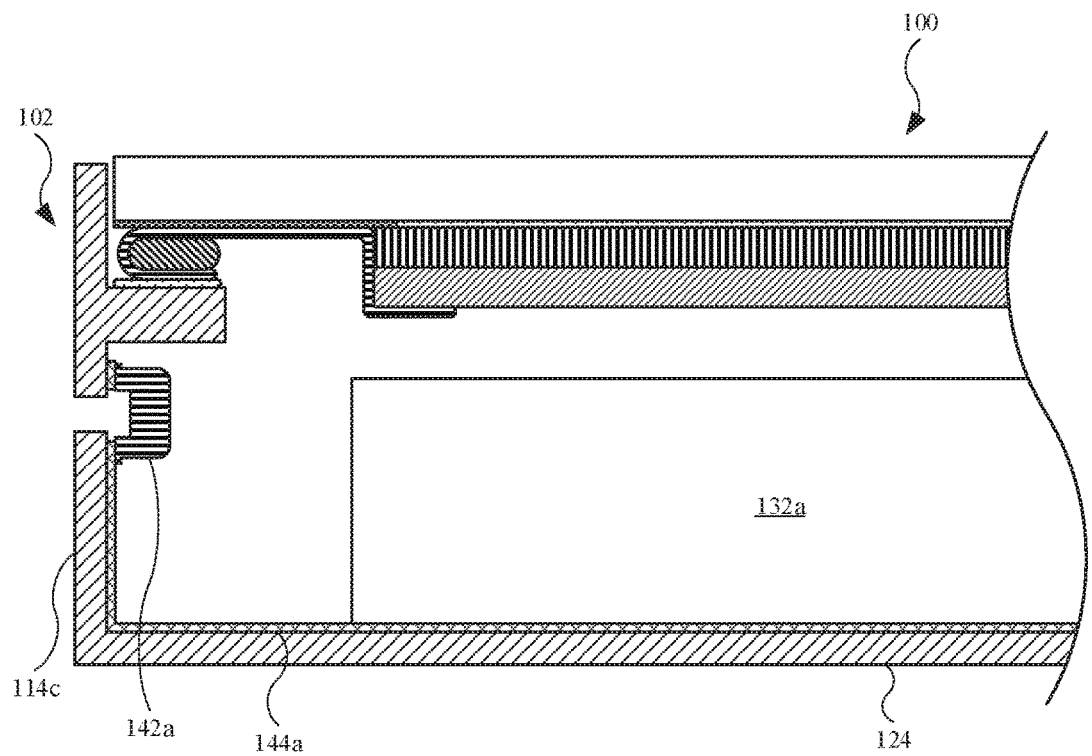
FIG. 14 illustrates a cross sectional view of the electronic device, showing the microphone positioned along the enclosure.

FIG. 14 illustrates a cross sectional view of the electronic device 100, showing the microphone 142a positioned along the enclosure 102. As shown, the microphone 142a is electrically and mechanically coupled to the flexible circuit 144a. The flexible circuit 144a may run along the wall 124 and the sidewall 114c such that the microphone 142a is aligned with an opening (not labeled in FIG. 14) of the sidewall 114c. The flexible circuit 144a may adhesively secure with the wall 124 and the sidewall 114c. Also, the flexible circuit 144a runs below the battery module 132a such that the flexible circuit 144a is positioned between the battery module 132a and the wall 124.

Figure 15:
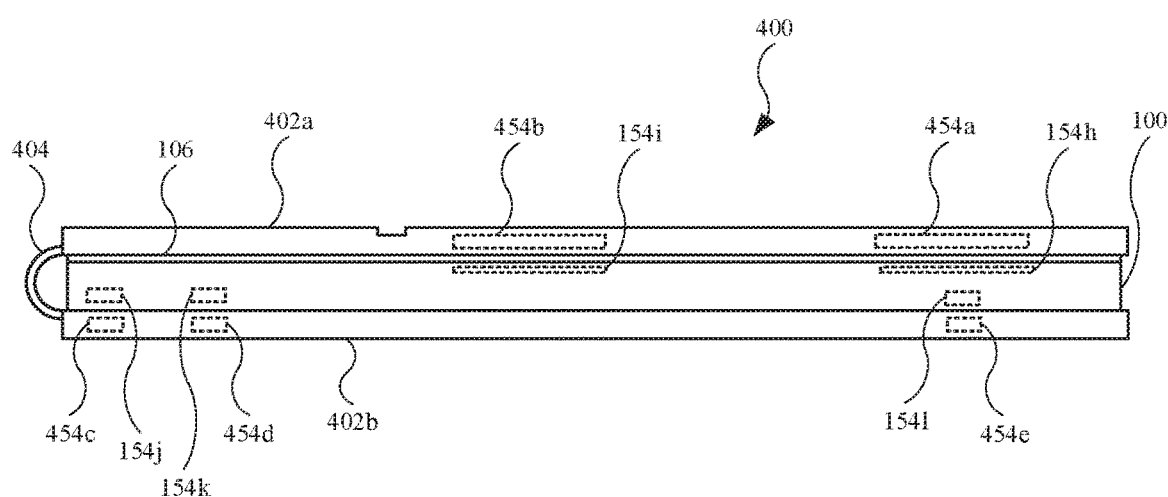
FIG. 15 illustrates a side view of the electronic device carried by an accessory device.

FIG. 15 illustrates a side view of the electronic device 100 carried by an accessory device 400, in accordance with some described embodiments. The accessory device 400 may include a folio or a cover. The accessory device 400 may include a first cover portion 402a coupled with a second cover portion 402b by a hinge 404. The first cover portion 402a may cover the transparent cover 106 and the display assembly 104 (not shown in FIG. 15). In order to retain the first cover portion 402a with the electronic device 100, the first cover portion 402a may include magnetic elements 454a and magnetic elements 454b that magnetically couple with the magnetic element 154h and the magnetic element 154i, respectively, with the magnetic element 154h and the magnetic element 154i secured with the display assembly 104 (as shown in FIG. 4).

The second cover portion 402b may include a keyboard (not shown in FIG. 15) designed to interact with the electronic device 100. In order to retain the second cover portion 402b with the electronic device 100, the second cover portion 402b may include magnetic elements 454c, magnetic elements 454d, and magnetic elements 454e. The magnetic elements 454c may magnetically couple with magnetic elements 154j in the electronic device 100. The magnetic elements 454d and the magnetic elements 454e may magnetically couple with magnetic elements 154k and magnetic elements 154l, respectively, in the electronic device 100. The magnetic elements 154k and magnetic elements 154l may represent magnetic elements located on the wall 124 between the internal walls of an audio module (shown in FIG. 3). For example, the magnetic elements 154k and magnetic elements 154l may be located between the internal walls 138d and the internal walls 138b (shown in FIG. 3), respectively.

The magnetic elements in the electronic device 100 may be relatively small in size. This may promote aligning (e.g., centering) the electronic device 100 with respect to the accessory device 400. Whereas fewer, larger magnetic elements in the electronic device 100 may provide a stronger magnetic coupling force with magnets of the accessory device 400, the smaller magnetic elements may ease a user's ability to align the electronic device 100 with the accessory device 400. Further, the relatively large number of small magnets may at least partially compensate for a relatively large external magnetic field generated by a single, relatively larger magnetic element. As a result, the magnetic elements of the electronic device 100 remain magnetically coupled with the magnetic elements of the accessory device 400.

Figure 16:
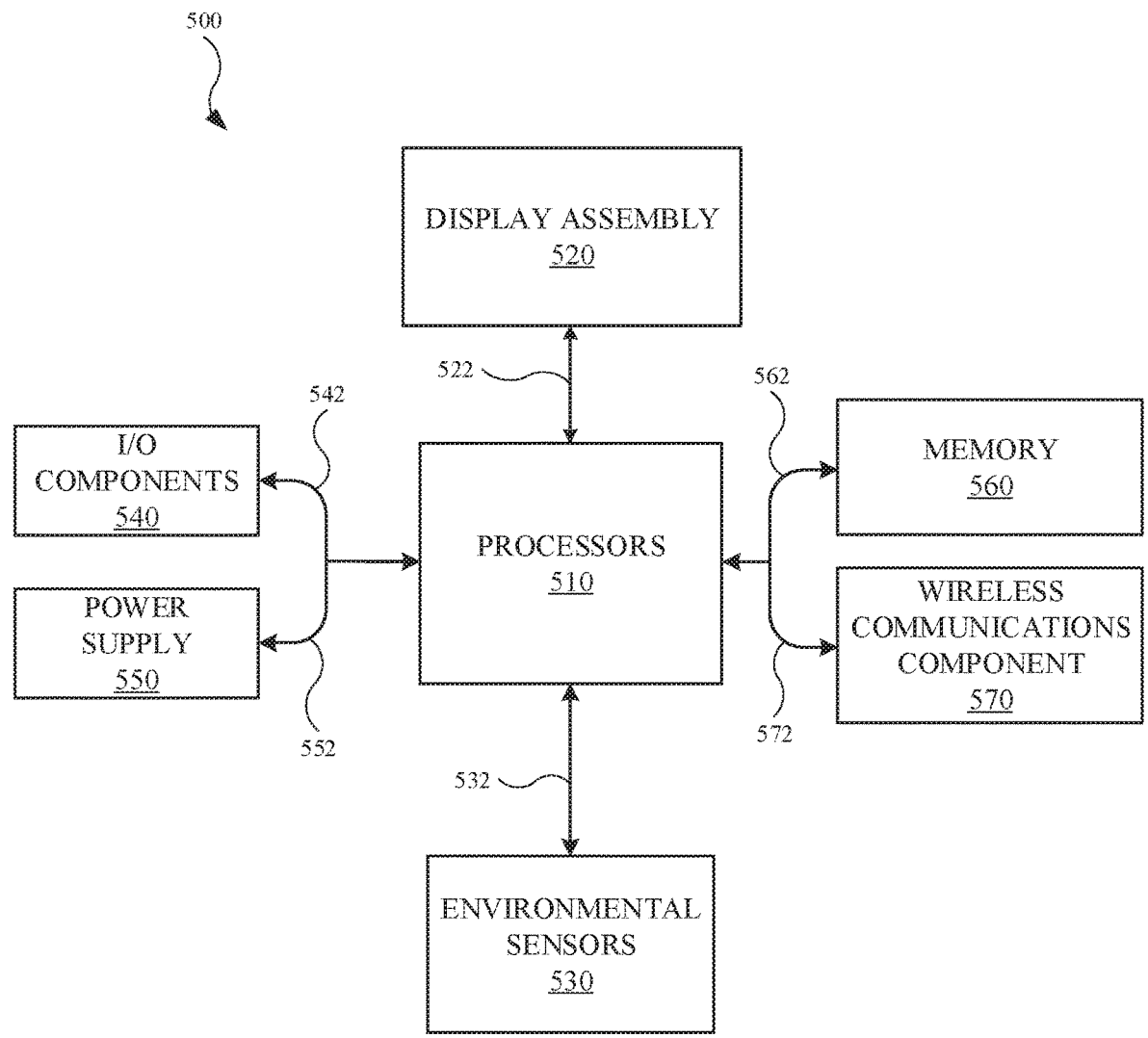
FIG. 16 illustrates a block diagram of an electronic device, in accordance with some described embodiments.

FIG. 16 illustrates a block diagram of an electronic device 500, in accordance with some described embodiments. The electronic device 500 may include a portable electronic device that is capable of implementing the various techniques described herein. The electronic device 500 may include any features described herein for an electronic device. Also, electronic devices described herein may include any feature or features described for the electronic device 500. In some embodiments, the electronic device 500 takes the form of the electronic device 100 (shown in FIG. 1). The electronic device 500 can include one or more processors 510 for executing functions of the electronic device 500. The one or more processors 510 can refer to at least one of a central processing unit (CPU) and at least one microcontroller for performing dedicated functions.

According to some embodiments, the electronic device 500 can include a display assembly 520. The display assembly 520 is capable of presenting a user interface that includes icons (representing software applications), textual images, and/or motion images. In some examples, each icon can be associated with a respective function (such as a software application) that can be executed by the one or more processors 510. In some cases, the display assembly 520 includes a display layer (not illustrated), which can include a liquid-crystal display (LCD), light-emitting diode display (LED), organic light-emitting diode display (OLED), or the like. According to some embodiments, the display assembly 520 includes a touch input detection component, or touch input layer, that can be configured to detect changes in an electrical parameter (e.g., electrical capacitance value) when the user's appendage (acting as a capacitor) or a digital stylus comes into proximity with the display assembly 520 (or in contact with a transparent cover that covers the display assembly 520). The display assembly 520 is connected to the one or more processors 510 via one or more connection cables 522. The one or more connection cables 522 may include the flexible circuits shown and described in FIG. 4.

According to some embodiments, the electronic device 500 can include one or more environmental sensors 530 capable of detecting environmental conditions that are present within, or general proximate to, the electronic device 500. In some examples, the one or more environmental sensors 530 may include a humidity sensor, a temperature sensor, a liquid sensor, an ambient pressure sensor, underwater depth sensor, a magnetic field sensor, a strain gage, a capacitive sensor, a barometric pressure sensor, a microphone, and/or a thermometer. In some embodiments, the one or more environmental sensors 530 can determine whether the electronic device 500 is exposed to a specific environmental stimulus (e.g., moisture). In response, the one or more processors 510 can modify a notification that is presented by the display assembly 520 that corresponds to the specific environmental stimulus. The one or more environmental sensors 530 is/are connected to the one or more processors 510 via one or more connection cables 532.

According to some embodiments, the electronic device 500 can include one or more input/output components 540 (also referred to as "I/O components") that enable communication between a user and the electronic device 500. In some cases, the one or more input/output components 540 can refer to a button or a switch that is capable of actuation by the user. In some cases, the one or more input/output components 540 can refer to a soft key that is flexibly programmable to invoke any number of functions. In some examples, the one or more input/output components 540 can refer to a switch having a mechanical actuator (e.g., spring-based switch, slide-switch, rocker switch, rotating dial, etc.) or other moving parts that enable the switch to be actuated by the user. In some examples, the one or more input/output components 540 can include a capacitive switch that is integrated with the display assembly 520. Also, the one or more input/output components 540 can include a connector, such as the connector 120 (shown in FIG. 3). Further, the one or more input/output components 540 can refer to electrical contacts, such as the electrical contact 123*a*, the electrical contact 123*b*, and the electrical contact 123*c* on the wall 124 (as shown in FIG. 3). When the one or more input/output components 540 are used, the one or more input/output components 540 can generate an electrical signal that is provided to the one or more processors 510 via one or more connection cables 542.

According to some embodiments, the electronic device 500 can include a power supply 550 that is capable of providing energy to the operational components of the electronic device 500. The power supply 550 may refer to, for example, the battery module 132*a* and the battery module 132*b* (shown in FIG. 3). In some examples, the power supply 550 can refer to a rechargeable battery. The power supply 550 can be connected to the one or more processors 510 via one or more connection cables 552. The power supply 550 can be directly connected to other devices of the electronic device 500, such as the one or more input/output components 540. In some examples, the electronic device 500 can receive power from another power source (e.g., an external charging device) not shown in FIG. 16.

According to some embodiments, the electronic device 500 can include memory 560, which can include a single disk or multiple disks (e.g., hard drives), and includes a storage management module that manages one or more partitions within the memory 560. In some cases, the memory 560 can include flash memory, semiconductor (solid state) memory or the like. The memory 560 can also include a Random Access Memory (RAM) and a Read-Only Memory (ROM). The ROM can store programs, utilities or processes to be executed in a non-volatile manner. The RAM can provide volatile data storage, and stores instructions related to the operation of the electronic device 500. In some embodiments, the memory 560 refers to a non-transitory computer readable medium, where an operating system (OS) is established at the memory 560 that can be configured to execute software applications that are stored at the memory 560. The one or more processors 510 can also be used to execute software applications that are stored at the memory 560. In some embodiments, a data bus 562 can facilitate data transfer between the memory 560 and the one or more processors 510.

According to some embodiments, the electronic device 500 can include a wireless communications component 570. The wireless communications component 570 can communicate with other electronic devices via any number of wireless communication protocols, including at least one of a global network (e.g., the Internet), a wide area network, a local area network, a wireless personal area network (WPAN), or the like. In some examples, the wireless communications component 570 can transmit data to the other electronic devices over IEEE 802.11 (e.g., a Wi-Fi® networking system), Bluetooth (IEEE 802.15.1), ZigBee, Wireless USB, Near-Field Communication (NFC), a cellular network system (e.g., a 3G/4G/5G network such as UMTS, LTE, etc.), or the like. A network/bus interface 572 can couple the wireless communications component 570 to the one or more processors 510.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A portable electronic device, comprising:
   an enclosure comprising a back wall and sidewalls that extend from the back wall to define an internal volume;
   internal walls extending from the back wall and positioned between the sidewalls;
   an audio module coupled with the internal walls, the audio module capable of acoustically driving the back wall to generate acoustical energy;
   a display assembly; and
   an inductive charging unit capable of inductively charging an accessory that is used with the display assembly.

2. The portable electronic device of claim 1, wherein the sidewalls comprise a metal sidewall formed of a metal, the metal sidewall comprising an opening filled with a non-metal material, wherein the inductive charging unit is positioned in the internal volume at the non-metal material.

3. The portable electronic device of claim 2, further comprising a microphone, wherein:
   the sidewalls comprise a first sidewall,
   the sidewalls comprise a second sidewall having a through hole, and
   the microphone is positioned along the first sidewall and aligned with the through hole.

4. The portable electronic device of claim 3, wherein the first sidewall is parallel with respect to the second sidewall.

5. The portable electronic device of claim 2, further comprising:
   a transparent cover that covers the display assembly;

a border that extends along the transparent cover, the border comprising a uniform dimension and having an opening;

a light transmissive material that is positioned in the opening; and a vision system positioned in the internal volume and aligned with the light transmissive material, wherein the vision system facilitates facial recognition operations.

6. The portable electronic device of claim 1, further comprising:

a non-metal material, wherein:

the back wall defines:

a first section, a second section, and an aperture that divides the first section from the second section, the aperture comprising a bridge section that connects to the first section and the second section, and the non-metal material fills the aperture and covers the bridge section.

7. The portable electronic device of claim 1, further comprising a magnet positioned between the internal walls and that is separate from the audio module.

8. A portable electronic device, comprising:

a display assembly configured to present visual information;

a transparent cover coupled with the display assembly;

an enclosure coupled with the transparent cover, the enclosure comprising:

a metal back wall, sidewalls extending from the metal back wall, the sidewalls secured with the transparent cover, and an aperture through the metal back wall and dividing the metal back wall into a first section and a second section, wherein the aperture comprises a metal bridge section connecting the first section and the second section; and a non-metal material that fills the aperture and covers the metal bridge section.

9. The portable electronic device of claim 8, wherein the non-metal material provides a window for radio frequency transmission.

10. The portable electronic device of claim 8, wherein the metal bridge section is integrated with the enclosure to define a unitary enclosure.

11. The portable electronic device of claim 8, further comprising:

internal walls extending from the metal back wall and positioned between the sidewalls; and an audio module coupled with the internal walls, the audio module capable of acoustically driving the metal back wall to generate acoustical energy.

12. The portable electronic device of claim 8, further comprising an inductive charging unit positioned along a sidewall of the sidewalls, the inductive charging unit capable of inductively charging an object external to the enclosure.

* * * * *